United States Patent [19]

Echols, John C.

[11] Patent Number: 5,231,326
[45] Date of Patent: Jul. 27, 1993

[54] PIEZOELECTRIC ELECTRONIC SWITCH

[75] Inventor: Echols, John C., Santa Barbara, Calif.

[73] Assignee: Essex Electronics, Inc., Carpinteria, Calif.

[21] Appl. No.: 828,364

[22] Filed: Jan. 30, 1992

[51] Int. Cl.⁵ .......................................... H01L 41/08
[52] U.S. Cl. .................................. 310/339; 310/319; 310/330; 310/338; 310/346
[58] Field of Search .................. 310/330-332, 310/338, 339, 317, 319, 315, 346; 341/34

[56] References Cited

U.S. PATENT DOCUMENTS

| | | | |
|---|---|---|---|
| 3,940,637 | 2/1976 | Ohigashi et al. | 310/339 X |
| 4,521,712 | 6/1985 | Braun et al. | 310/339 |
| 4,580,074 | 4/1986 | Gilman | 310/339 |
| 4,761,582 | 8/1988 | McKee | 310/339 X |

Primary Examiner—Mark O. Budd
Attorney, Agent, or Firm—Learman & McCulloch

[57] ABSTRACT

An electronic switch is disclosed using a piezoelectric push button transducer and an electronic switching circuit. The push button piezoelectric transducer is connected with the switching circuit with a polarity to provide a switching voltage in response to actuation of the push button switch by finger pressure. The connection is such that the polarity of the voltage generated as a result of differential thermal expansion of the piezoelectric transducer is opposite that produced by finger pressure on the push button switch and does not produce false switching from fast temperature rise. In order to protect against false switching due to high temperature soak of the electronic switch, a thermistor is provided in the electronic switching circuit.

15 Claims, 2 Drawing Sheets

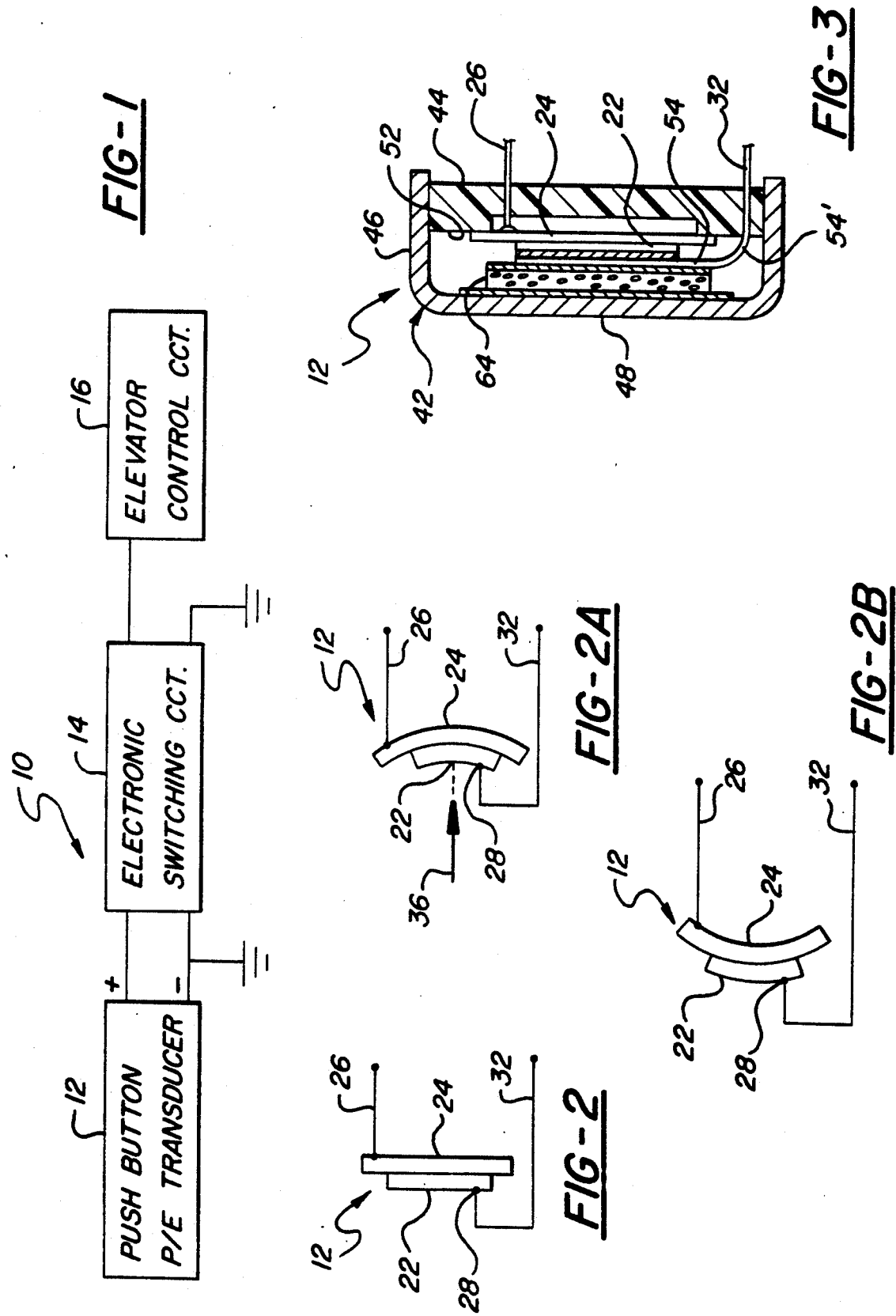

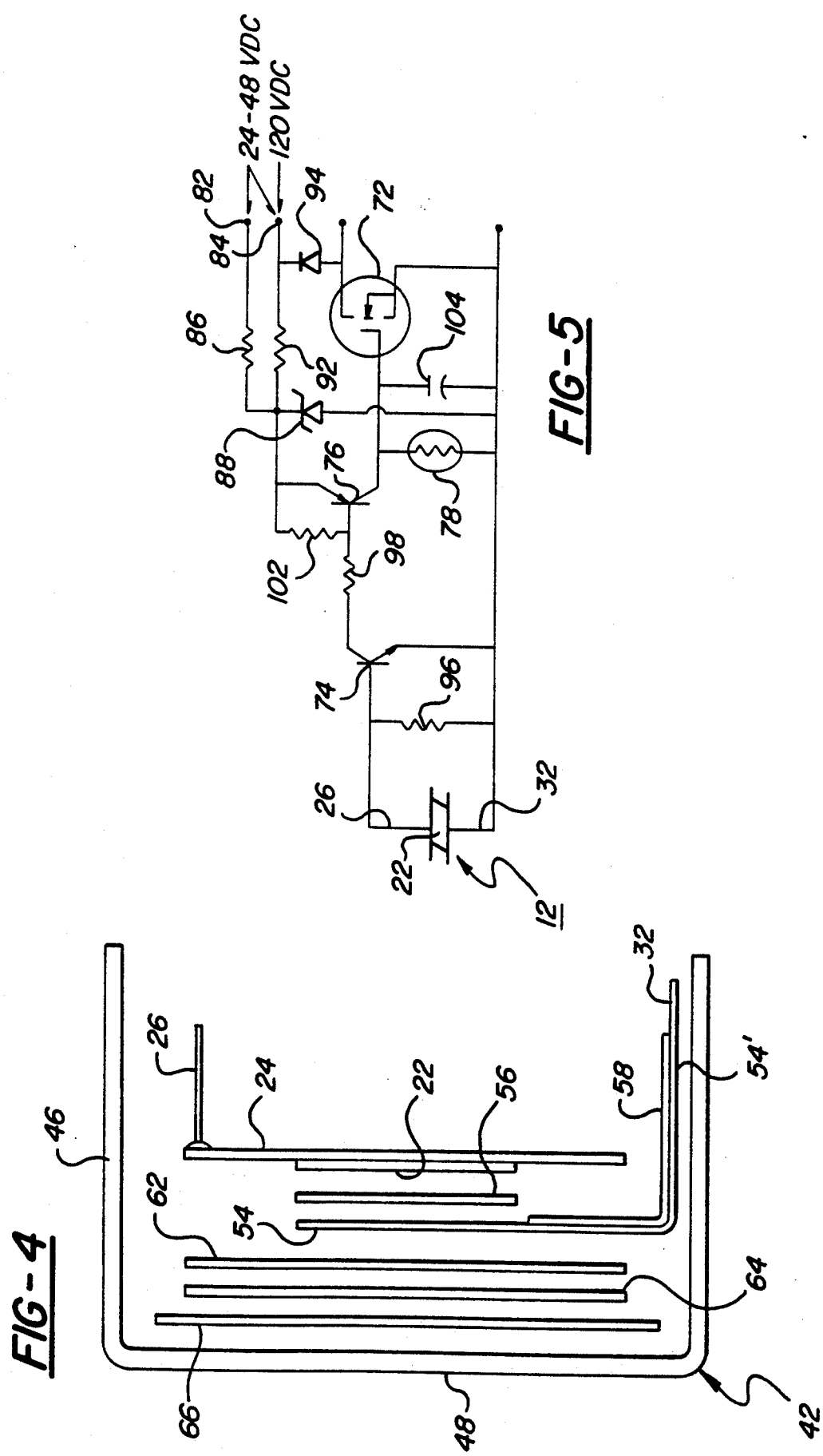

PIEZOELECTRIC ELECTRONIC SWITCH

FIELD OF THE INVENTION

This invention relates to electronic switches and more particularly, it relates to piezoelectric electronic switches.

BACKGROUND OF THE INVENTION

Electronic switches of a known type, actuated by manual finger pressure or other such engagement, employ a piezoelectric element to generate a switching voltage for an electronic switching circuit. Such electronic switches have a wide variety of applications. A particularly important application is in the manually actuated switches for elevators in public buildings, namely the so-called hall call switches and car call switches.

In the prior art, it is a common practice to construct momentary push button switches with a thin plate of piezoelectric material, preferably a ceramic plate, which is operated in a bending mode by finger pressure to generate a signal voltage for an electronic switching circuit. Typically, the piezoelectric plate is bonded in face-to-face engagement with a thin metal plate so as to form a bendable laminate responsive to finger pressure. In this prior art, the push button overlays the laminate and imparts pressure to the face of the metal plate urging it in a direction toward the piezoelectric plate tending to bend the piezoelectric plate so that its free surface is convex. This generates a DC voltage between a first electrode engaging the free face of the piezoelectric plate and the metal plate which serves as a second electrode on the other face of the piezoelectric plate. The polarity of the generated voltage in this push button operation is such that the voltage on the first electrode is positive relative to that on the second electrode and is applied to the electronic switching circuit to cause a change of switch state, i.e. from open to close.

It has been found that such prior art piezoelectric transducers are temperature responsive to such an extent that certain temperature conditions may cause undesired switch operation. Further, it has been found that the laminate formed by the piezoelectric plate and the metal plate responds to increasing temperature by bending of the piezoelectric plate such that its free face is convex and hence it generates a signal voltage of the same polarity as that produced by finger pressure. If the rate of change of temperature rise is fast enough to overcome the voltage bleed-off effects in the switching circuit, the switch will turn on. In case of a sudden heat rise, caused for example by a building fire, the switch may be inadvertently actuated by the differential thermal expansion in the laminate. It is believed, for example, that in a public building elevator system sudden heat rise caused by outbreak of fire on one of the floors could result in a dangerous situation by calling elevator cars to that floor. Also, it has been found that such prior art electronic switching circuits are susceptible to malfunction as a result of a prolonged high temperature exposure or "soak"; such a high temperature soak will, at some point, cause the electronic elements of the switching circuit to leak or conduct. When the leakage gets high enough, the output switch, such as a field effect resistor (FET) will turn on.

A general object of this invention is to provide an improved electronic switch of the piezoelectric type and overcome certain of the disadvantages of the prior art.

SUMMARY OF THE INVENTION

In accordance with this invention, an improved piezoelectric transducer for a push button electronic switch is provided which will not produce false switching in response to exposure to undue temperature change. Further, such a switch is provided with an improved structure which is of compact design, highly reliable and economical to manufacture.

In accordance with this, a push button electronic switch with a piezoelectric transducer is provided which produces a signal voltage in response to push button actuation which is of polarity opposite that produced in response to actuation by differential thermal expansion.

Further, in accordance with this invention, an electronic switch of the piezoelectric transducer type is provided which is resistant to false switching due to high temperature soak of the electronic switching circuit.

A complete understanding of this invention may be obtained from the detailed description that follows taken with the accompanying drawings.

DESCRIPTION OF THE DRAWINGS

FIG. 1 is a block diagram of the electronic switching circuit of this invention;

FIG. 2 is a schematic of the piezoelectric transducer of this invention in its normal rest condition;

FIG. 2A is a schematic of the piezoelectric transducer in a stressed condition resulting from push button pressure;

FIG. 2B is a schematic of the transducer in a stressed condition resulting from thermal expansion;

FIG. 3 is a cross-sectional view of the electronic push button transducer structure of this invention;

FIG. 4 is an exploded view of the switch of FIG. 3; and

FIG. 5 is a schematic diagram of the electronic switching circuit of this invention.

BEST MODE FOR CARRYING OUT THE INVENTION

Referring now to the drawings, an illustrative embodiment of the invention is shown in an electronic switch of the type which is actuated by a manual push button which bends a piezoelectric transducer to generate a switch signal voltage. Further, the illustrative embodiment is described with reference to an elevator call switch. It will be appreciated however, as the description proceeds that the invention is useful in a wide variety of applications and it may be realized in many different embodiments.

Referring now to the block diagram of FIG. 1, the electronic switch 10 of this invention comprises a push button piezoelectric transducer 12 coupled with an electronic switching circuit 14. The electronic switch 10, in the illustrated embodiment, is connected in circuit with an elevator control circuit 16. In the circuit of FIG. 1, actuation of the push button transducer 12 causes a DC voltage of positive polarity to be generated at the signal output terminal with reference to the grounded terminal. This signal polarity causes the electronic switching circuit 14 to turn on, i.e. close, a solid state switch between its output terminal and ground.

The push button transducer 12 is illustrated schematically in FIGS. 2, 2A and 2B. The transducer comprises a thin piezoelectric plate 22 having one face bonded to a face of a thin metal plate 24. Typically, the piezoelectric plate 22 is a ceramic material, such as bariumtitanate, and the metal plate 24 is brass. The metal plate 24 constitutes one electrode of the piezoelectric plate and a signal output lead 26 is electrically connected thereto. Another metallic electrode 28 is bonded to the free face of the piezoelectric plate 22. A ground lead 32 is electrically connected with the electrode 28. The piezoelectric plate 22 and the metal plate 24 constitute a laminate of integral construction and the plates are bendable in unison when subjected to forces acting in a direction normal to the plane of the laminate. Bending of a piezoelectric plate, as is well-known, generates a voltage during the bending motion across the opposite surfaces of the plate. In the illustrative embodiment, the piezoelectric plate 22 generates a voltage which is of positive polarity on the convex surface and negative polarity on the concave surface. With the plate 22 in its normal rest position shown in FIG. 2A, the voltage generated between the signal lead 26 and ground lead 32 is zero.

FIG. 2A illustrates the transducer 12 in a stressed condition as it is bent due to finger pressure in the direction represented by the arrow 36. With the pressure applied in the indicated direction, the piezoelectric plate 22 is urged toward the metal plate 24 and its free surface is concave and its interface with the metal plate 24 is convex. This flexing o bending of the piezoelectric plate 22 generates a positive voltage at the signal voltage lead 26 and a negative voltage at the ground lead 32. This voltage is applied to the input terminals of the electronic switching circuit 14 and is sufficient, in response to movement by momentary finger pressure, to switch the electronic switching circuit from off to on.

FIG. 2B shows the transducer 12 in a stressed condition due to elevated temperature. The metal plate 24 and the piezoelectric plate 22 have different temperature coefficients of expansion, and temperature above that at which they were bonded together causes bending as indicated. In particular, the coefficient of expansion of the piezoelectric plate 22 is less than that of the metal plate 24 and consequently, the free face of the piezoelectric plate 22 is convex and its interface with the plate 24 is concave. This flexing or bending causes the piezoelectric plate 22 to generate a voltage of positive polarity on the ground lead 32 and a voltage of negative polarity on the signal voltage lead 26. When this voltage is applied to the input of the electronic switching circuit 14, the polarity is such that the switch remains off or open. Thus, due to the polarity of the voltage applied to the switching circuit 14, false switching is not produced by the voltage resulting from differential thermal expansion of the transducer.

The construction of the push button piezoelectric transducer 1 in accordance with the invention is shown in FIG. 3 and is shown in further detail in the exploded view of FIG. 4. The push button transducer comprises a cup-shaped push button 42 which is mounted on a base 44. The cup-shaped button comprises an annular wall 46 and a flat push-plate 48 which is sufficiently flexible to yield under light finger pressure. The base 44 is suitably circular and made of relatively rigid insulating material. The base 44 includes a unitary annular boss 52. The laminate, comprising metal plate 24 and piezoelectric plate 22, is mounted with the peripheral edge of the metal plate 24 seated on the boss 52. A metal foil, preferably copper sheet 54 is adhesively bonded to the free face of piezoelectric plate 22 by a layer of conductive tape 56. The metal foil sheet 54 and the tape 56 are preferably at least coextensive with the free face of plate 22 and the foil sheet is shaped with a unitary extension conductor 54' which extends beyond the plate 22 base 44 where it is connected with the lead 32. An electrical insulating layer 58 is disposed between the foil sheet 54 and the metal plate 24 and secured to the foil sheet, preferably by adhesive. The metal foil sheet 54 is bonded to the piezoelectric plate 22 by a conductive tape 56 and provides an electrode coextensive with the plate 22. It also provides a flat bonding surface for bonding to the flat push-plate 48 of the push button. For this purpose, bonding is provided by an adhesive layer 62 on the outer surface of the metal foil sheet 54. In order to provide thermal insulation between the pushplate 48 and the piezoelectric plate 22, a sheet 64 of thermal insulating material is interposed at the outer surface of the adhesive layer 62. Another adhesive layer 66 is interposed between the push-plate 48 and the outer surface of the insulating sheet 64.

In the construction described, the metal plate 24 is restrained by the base 44 at its outer periphery against movement and the layers between the piezoelectric plate 22 and the push-plate 48 are bonded together and movable in an axial direction as a unit. The push-plate 48 is resilient such that it may be deflected axially by finger pressure thus bending the piezoelectric plate 22 and metal plate 24 in unison and when the pressure is removed, the elastic restoring forces return the assembly to its normal or unstressed state. The thermal insulation of sheet 64 prevents heat from the user's finger, during cold operation, from causing negative voltage generation which would otherwise result from differential thermal expansion of the plates 22 and 24.

The piezoelectric plate 22 is provided with a foil electrode 54 by use of adhesive tape. This affords a significant advantage over the conventional solder-connected electrode wire. It provides a flat bonding area for bonding, through intermediate layers, to the flat push-plate of the push button. Also, in the event of accidental damage causing a crack in the piezoelectric plate 22, the electrode will likely continue to maintain contact with the entire area of the piezoelectric plate except for the small area of the crack itself and the output signal would be reduced only slightly due to the crack. In the conventional solder-connection the output is reduced in proportion to the area of the plate which is disconnected by the crack from the soldered electrode. The conductive tape is preferably SCOTCH TM 9703 conductive adhesive transfer tape available from 3M Corporation, St. Paul, Minn.

The piezoelectric transducer 12 and the electronic switching circuit 14 of this invention are shown schematically in FIG. 5. The circuit comprises, in general, an output switch, i.e. the field effect transistor (FET) 72 with first and second switching transistors 74 and 76 interposed between the push button transducer 12 and the FET 72. Protection against false switching due to high temperature soak is provided by a negative temperature coefficient thermistor 78 which is coupled to the gate of the FET 72. The electronic switching circuit 14 includes alternate voltage supply terminals 82 and 84. When a supply voltage of 24 to 48 volts DC is used, it is connected to both terminals 82 and 84 and applied through resistors 86 and 92 in parallel to a zener diode 88. If a supply voltage of 120 volts DC is used, it is applied to terminal 84 which is connected through a resistor 92 to the zener diode 88. The FET 72 is protected against fly-back voltage by a diode 94.

The switching transistor 74 has its base connected with the lead 26 of transducer 12 and its emitter connected with the ground lead 32. A resistor 96 is connected between emitter and base. The collector of switching transistor 74 is connected through a resistor 98 to the base of switching transistor 76. The emitter of this transistor is connected in the cathode of the zener diode 88 and a resistor 102 is connected between the emitter and base. The collector of the transistor 76 is connected directly to the gate of the FET 72 and is connected to the ground lead through the parallel connection of the thermistor 78 and a capacitor 104 which slows the voltage change at the gate. The source of FET 72 is connected to the ground lead and the output is taken between the drain and ground.

In operation, actuation of the push button transducer 12 by finger pressure causes a signal voltage output of positive polarity to be generated on the signal voltage lead 26 and the switching transistor 74 is turned on. This turns on the switching transistor 76 which in turn causes a positive voltage across the thermistor 78 and capacitor 104 which is applied to the gate of the FET 72. Accordingly, FET 72 is turned on. When the voltage generated by the push button transducer 12 is reduced below the threshold voltage of switching transducer 74, the FET 72 is turned off.

In the event that the push button transducer is subjected to a fast temperature rise causing the piezoelectric element 22 to be bent as described with reference to FIG. 2B, the voltage generated at output lead 26 will be of negative polarity. This voltage holds transistor 74 turned off and accordingly FET 72 is held in the off condition. In the event that the electronic switching circuit is subjected to a high temperature soak, for example, greater than one hundred degrees C., the negative temperature coefficient thermistor 78 is effective to inhibit switching of the FET 72 to the on condition. In normal operation, (when there is no high temperature soak) the switching voltage is supplied across thermistor 72 through the series voltage dropping resistor 92 (for 120 volt supply), and switching transistor 76. The gate voltage must reach a level of about 6 to 10 volts for the FET to turn on. In abnormal operation with high temperature soak, the resistance of thermistor 78 is reduced and the voltage at the gate of the FET 72 is diminished to a value below that required to turn on the FET. This is obtained when switching transistors 74 and 76 are turned on as the result of either push button actuation or leakage of the semiconductor components due to the high temperature soak. The values of the thermistor and the voltage dropping resistor may be suitably selected to prevent switch operation with temperatures above about seventy to eighty degrees C. When the switch temperature decreases to a level below seventy degrees C. the switch will function normally.

Although the description of this invention has been given with reference to a particular embodiment, it is not to be construed in a limiting sense. Many variations and modifications will now occur to those skilled in the art. For a definition of the invention reference is made to the appended claims.

What is claimed is:

1. In a push button switch of the type comprising a piezoelectric element having opposite faces with one face bonded to a flexible support pate to form a laminate, electrodes coupled with the opposite faces of said piezoelectric element, an electronic switching circuit responsive to a predetermined voltage having a first polarity to switch its conductive state, a push button for flexing said laminate and thereby generating a voltage between said electrodes having said first polarity and having a magnitude at least as great as that of said predetermined voltage, said electrodes being electrically coupled with said circuit for switching its conductive state when said laminate is flexed by said push button, said support plate and said piezoelectric element having different temperature coefficients of expansion whereby said laminate is flexed by a predetermined rate of temperature increase to generate a voltage between said electrodes having a magnitude at least as great as that of said predetermined voltage, the improvement comprising:

said push button being coupled with said laminate for flexing it in a direction opposite the direction the laminate is flexed due to increasing temperature, whereby the voltage produced by flexion of the laminate due to increasing temperature has a polarity opposite that of said first polarity.

2. The invention as defined in claim 1 wherein said support plate is metal and is conductively bonded to said piezoelectric element.

3. The invention as defined in claim 1 wherein said support plate is brass and said piezoelectric element is a ceramic plate.

4. The invention as defined in claim 1 wherein said push button urges said piezoelectric element toward said support plate.

5. The invention as defined in claim 2 wherein said push button urges said piezoelectric element toward said support plate, one electrode is connected directly with said support plate and the other electrode comprises a metal layer contacting substantially the entire face of the piezoelectric element.

6. The invention as defined in claim 5 wherein said metal layer comprises a metal foil, said metal foil being connected with said piezoelectric element by a conductive tape.

7. The invention as defined in claim 6 wherein said metal foil is secured to the face of the push button by a layer of adhesive.

8. The invention as defined in claim 7 including a layer of thermal insulation between said push button and said piezoelectric element.

9. The invention as defined in claim 1 wherein said switching circuit comprises:

a semi-conductor switch having an input circuit and an output circuit, and a thermistor in said input circuit for inhibiting switching of said semi-conductor switch in response to elevated temperature.

10. The invention as defined in claim 9 wherein said semi-conductor switch is an FET.

11. The invention as defined in claim 10 wherein said thermistor has a negative temperature coefficient of resistance.

12. A push button switch comprising a piezoelectric element having opposite faces with one face bonded to a flexible support plate to form a laminate, electrodes coupled with the opposite faces of said piezoelectric element, a push button for flexing said laminate and thereby generating a voltage between said electrodes, and an electronic switching circuit, said electrodes being electrically coupled with said circuit for switching its conductive state when said laminate is flexed by said push button, said support plate and said piezoelectric element having different temperature coefficients of expansion whereby said laminate may be flexed by increasing temperature and generate a voltage between said electrodes, said push button being coupled with said laminate for flexing it in a direction opposite the direction the laminate flexes due to increasing temperature, said switching circuit comprising a switch having an input circuit and an output circuit and a thermistor in said input circuit for inhibiting switching of said switch in response to an elevation in temperature.

13. The invention as defined in claim 12 wherein said switch comprises a semiconductor.

14. The invention as defined in claim 13 wherein said semiconductor is an FET.

15. The invention as defined in claim 12 wherein said thermistor has a negative temperature coefficient of resistance.

* * * * *

UNITED STATES PATENT AND TRADEMARK OFFICE
CERTIFICATE OF CORRECTION

PATENT NO. : 5,231,326
DATED : July 27, 1993
INVENTOR(S) : John C. Echols

It is certified that error appears in the above-identified patent and that said Letters Patent is hereby corrected as shown below:

Column 3, line 30, change "o" to -- or --; line 57, change "1" to -- 12 --.

Signed and Sealed this

Fifteenth Day of March, 1994

BRUCE LEHMAN

Attest:

Attesting Officer

Commissioner of Patents and Trademarks